United States Patent
Agrawal et al.

(10) Patent No.: US 10,997,498 B2
(45) Date of Patent: May 4, 2021

(54) APPARATUS AND METHOD FOR IN-MEMORY BINARY CONVOLUTION FOR ACCELERATING DEEP BINARY NEURAL NETWORKS BASED ON A NON-VOLATILE MEMORY STRUCTURE

(71) Applicant: GLOBALFOUNDRIES U.S. INC., Santa Clara, CA (US)

(72) Inventors: Amogh Agrawal, West Lafayette, IN (US); Ajey Poovannummoottil Jacob, Watervliet, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 174 days.

(21) Appl. No.: 16/366,187

(22) Filed: Mar. 27, 2019

(65) Prior Publication Data

US 2020/0311533 A1    Oct. 1, 2020

(51) Int. Cl.
| | |
|---|---|
| G11C 16/28 | (2006.01) |
| G06N 3/063 | (2006.01) |
| H01L 27/24 | (2006.01) |
| G11C 16/24 | (2006.01) |
| G11C 16/08 | (2006.01) |

(52) U.S. Cl.
CPC .......... *G06N 3/0635* (2013.01); *G11C 16/08* (2013.01); *G11C 16/24* (2013.01); *G11C 16/28* (2013.01); *H01L 27/2481* (2013.01)

(58) Field of Classification Search
CPC .. G06N 3/0635; H01L 27/2481; G11C 16/24; G11C 16/08; G11C 16/28; G11C 2213/82; G11C 2213/79; G11C 13/003; G11C 2013/0042; G11C 13/004; G11C 11/1673; G11C 11/1659; G11C 11/54
See application file for complete search history.

(56) References Cited

U.S. PATENT DOCUMENTS

| | | | |
|---|---|---|---|
| 10,073,733 B1* | 9/2018 | Jain ..................... | G06F 11/1044 |
| 2004/0141368 A1* | 7/2004 | Inaba ...................... | G11C 11/16 |
| | | | 365/158 |
| 2017/0053688 A1* | 2/2017 | Seo ........................ | H01L 27/228 |
| 2018/0144240 A1* | 5/2018 | Garbin .................... | G06N 3/063 |
| 2018/0293209 A1* | 10/2018 | Gokmen ............... | G06F 7/5443 |
| 2020/0034686 A1* | 1/2020 | Chiu ...................... | G06N 3/0635 |
| 2020/0098428 A1* | 3/2020 | Gaillardon ........... | G06N 3/0454 |
| 2020/0310758 A1* | 10/2020 | Desoli ..................... | G06N 3/04 |

OTHER PUBLICATIONS

Xiaoyu Sun et al.,"XNOR-RRAM: A scalable and parallel resistive synaptic architecture for binary neural networks," 2018, Design, Automation & Test in Europe Conference & Exhibition (DATE), Dresden, 2018, 6 pp.

(Continued)

*Primary Examiner* — Mushfique Siddique
(74) *Attorney, Agent, or Firm* — Michael Le Strange; Andrew M. Calderon; Roberts Calderon Safran & Cole, P.C.

(57) ABSTRACT

The present disclosure relates to a structure including a differential memory array circuit which is configured to perform a binary convolution of two input word operands by accumulating a summation of currents through a plurality of bits which are each arranged between a wordline and a sourceline in a horizontal direction and bitlines in a vertical direction.

20 Claims, 3 Drawing Sheets

(56) References Cited

OTHER PUBLICATIONS

Biswas et al., "Conv-RAM: An energy-efficient SRAM with embedded convolution computation for low-power CNN-machine learning applications," 2018 IEEE International Solid—State Circuits Conference—(ISSCC), San Francisco, CA, 2018, 3 pp.

Agrawal et al.,"Xcel-RAM: Accelerating Binary Neural Networks in High-Throughput SRAM Compute Arrays", School of Electrical and Computer Engineering, Purdue University, Oct. 2018, 10 pp.

* cited by examiner

APPARATUS AND METHOD FOR IN-MEMORY BINARY CONVOLUTION FOR ACCELERATING DEEP BINARY NEURAL NETWORKS BASED ON A NON-VOLATILE MEMORY STRUCTURE

FIELD OF THE INVENTION

The present disclosure relates to in-memory binary convolution, and more particularly, to a circuit and a method for in-memory binary convolution for accelerating deep binary neural networks based on a non-volatile memory (NVM) structure.

BACKGROUND

Memory devices are employed as internal storage areas in a computer or other electronic equipment. One specific type of memory used to store data in a computer is random access memory (RAM). RAM is typically used as the major on-chip as well as off-chip storage unit in a computing system, and is generally volatile in that once power is turned off, all data stored in the RAM is lost.

In the computing environment, programs and data are held in memory (i.e., random access memory (RAM)). Further, the central processing unit (CPU) is separate from the memory and can perform computations and logic functions. In recent years, processor speeds have increased significantly and memory has improved in density (i.e., the ability to store more data in less space). However, as memory density and processor speeds have increased, the data transfer rate between the CPU and the memory has not improved much and has created a bottleneck. The data transfer bottleneck between the CPU and the memory is called the von-Neumann bottleneck. In this scenario, the CPU will spend an increasing amount of time idle waiting for data to be fetched from memory.

Known computing systems running artificial intelligence applications spend most of their energy in data transfers. Overcoming this von-Neumann bottleneck using in-memory computing will reduce latency, improve processing speeds in the computing environment, and act as an on-demand accelerator for deep binary neural networks (BNNs).

SUMMARY

In an aspect of the disclosure, a structure includes a differential memory array circuit which is configured to perform a binary convolution of two input word operands by accumulating a summation of currents through a plurality of bits which are each arranged between a wordline and a sourceline in a horizontal direction and bitlines in a vertical direction.

In another aspect of the disclosure, a circuit includes an enhanced decoder which is configured to receive a first address to the first input word operand and a second address to the second input word operand and output a binary convolution output of the first input word operand and the second word input operand stored in a memory, and an operational amplifier (OpAmp) and analog to digital converter (ADC) which is configured to receive the binary convolution output and convert the binary convolution output to a digital output for an in-memory binary neural network (BNN) computation.

In another aspect of the disclosure, a method includes enabling a binary neural network (BNN) enable signal to perform an in-memory binary neural network (BNN) computation in a differential memory array circuit, inputting a first address to the first input word operand and a second address to the second input word operand to the differential memory array circuit, performing a binary convolution of the first input word operand and the second input word operand in the differential memory array circuit by accumulating a summation of currents through a plurality of bits in the differential memory array circuit, and outputting a binary convolution output as a result of the summation of currents.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to in-memory binary convolution, and more particularly, to a circuit and a method for in-memory binary convolution for accelerating deep binary neural networks based on a non-volatile memory (NVM) structure. In more specific embodiments, the present disclosure overcomes the von-Neumann bottleneck by implementing an in-memory binary neural network (BNN) computational framework based on a NVM structure. For example, the NVM structure in the present disclosure can include a two-transistor two-resistor spin-transfer torque magnetic random-access memory (2T2R STT MRAM). In another example, the NVM structure in the present disclosure can include 2T2R memristor/phase-change material devices. In particular, the in-memory BNN computational framework of the present disclosure includes a method of doing computations using a standard memory array structure with an additional analog-to-digital converter (ADC) in a peripheral circuitry along with enhanced wordline (WL) decoders to enable a binary convolution operation.

In comparison to known systems, the present disclosure retains the same amount of memory density (i.e., no change to the core memory layout) and does not alter/disturb regular memory operations (i.e., power performance area (PPA) is not changed). Further, in comparison to known computing systems, the present disclosure enhances the memory with a binary neural network (BNN) computation capability which is scalable to large deep networks because it is based on accumulating the currents. Deep networks have larger kernels which can be split up and stored into multiple memory rows/arrays. The accumulated current from one row gives a partial output, which can be summed from multiple rows/arrays to get the final output. Further, the present disclosure is configured to be an in-memory system (i.e., both input operands are stored in an array of the memory system and are computed upon within the memory array itself). In contrast, known systems require a sequential read access to the operands, followed by a computation step. A few known systems try to compute in-memory but require at least one input operand to come from outside a memory system. Accordingly and advantageously, by implementing the circuit and method described herein, it is now possible to overcome the issues of von-Neumann bottleneck by reducing latency, improving processing speeds in the computing environment, and providing an on demand accelerator for deep binary neural networks (BNNs).

Figure 1:
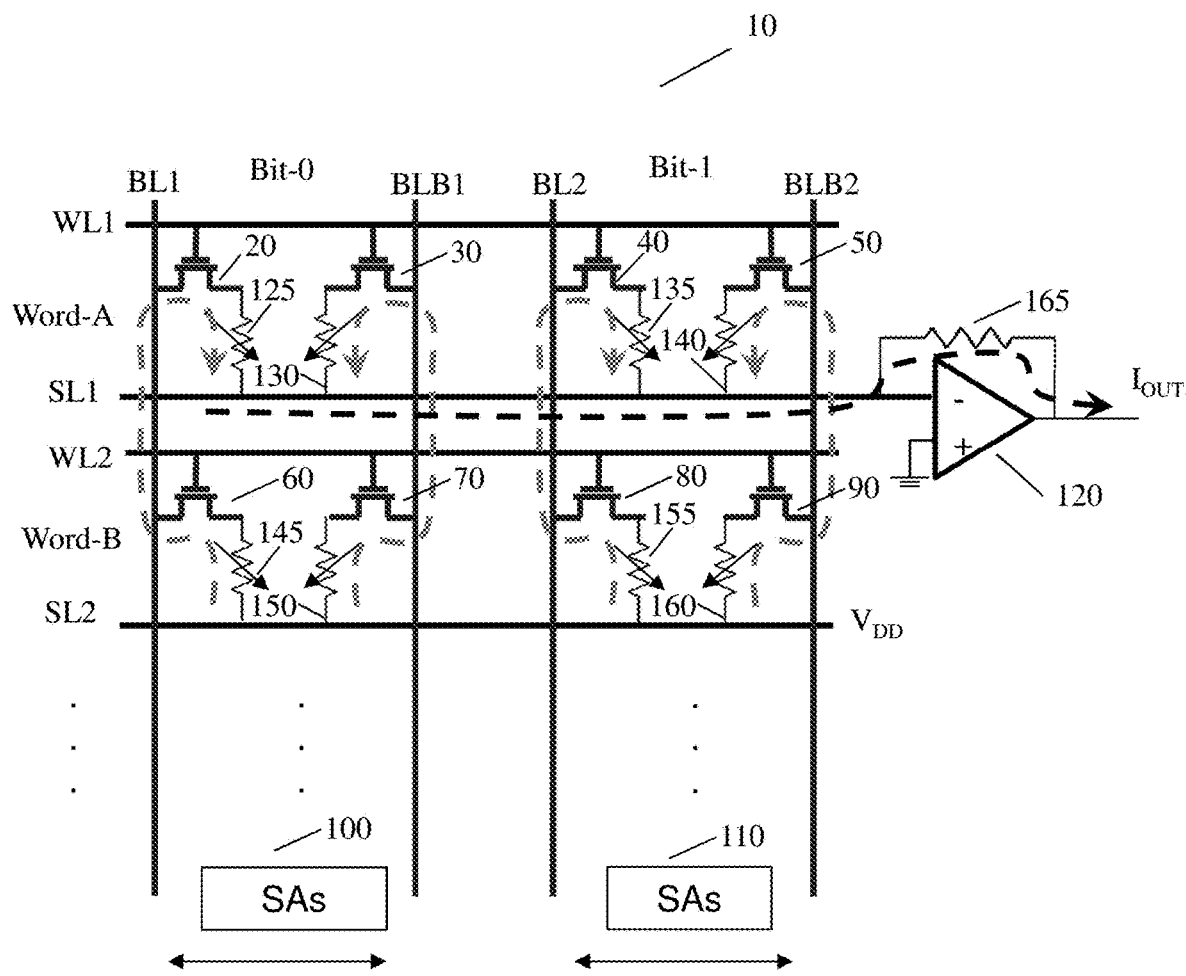
FIG. 1 shows an overview of a differential memory array structure in accordance with aspects of the present disclosure.

FIG. 1 shows an overview of a differential memory array structure in accordance with aspects of the present disclosure. In embodiments of the present disclosure, a differential memory array structure 10 includes a two transistor-two magnetic tunnel junction configuration (i.e., 2T-2MTJ). In the differential memory array structure 10, wordlines and sourcelines are in parallel in a horizontal direction, while bitlines and complement bitlines are in parallel in a vertical direction.

In particular, in FIG. 1, the differential memory array structure 10 includes a first NMOS transistor 20, resistors 125, 130, and a second NMOS transistor 30 for a Word-A and Bit-0 (also referred to as "A0") between a first wordline WL1 and a first sourceline SL1 in a horizontal direction and a first bitline BL1 and a first bitline complement BLB1 in a vertical direction. The differential memory array structure 10 also includes a third NMOS transistor 40, resistors 135, 140, and a fourth NMOS transistor 50 for a Word-A and Bit-1 (also referred to as "B1") between the first wordline WL1 and the first sourceline SL1 in the horizontal direction and a second bitline BL2 and a second bitline complement BLB2 in the vertical direction.

In FIG. 1, the differential memory array structure 10 also includes a fifth NMOS transistor 60, resistors 145, 150, and a sixth NMOS transistor 70 for a Word-B and Bit-0 (also referred to as "B0") between a second wordline WL2 and a second sourceline SL2 in the horizontal direction and the first bitline BL1 and the first bitline complement BLB1 in the vertical direction. The differential memory array structure 10 further includes a seventh NMOS transistor 80, resistors 155, 160, and an eighth NMOS transistor 90 for a Word-B and Bit-1 (also referred to as "B1") between the second wordline WL2 and the second sourceline SL2 and the second bitline BL2 and the second bitline complement BLB2 in the vertical direction.

The differential memory array structure 10 also includes a first set of sense amplifiers 100 between the first bitline BL1 and the first bitline complement BLB1 in the vertical direction and a second set of sense amplifiers 110 between the second bitline BL2 and the second bitline complement BL2 in the vertical direction. The differential memory array structure 10 also includes a resistor 165 and an operational amplifier (OpAmp) and analog to digital converter (ADC) 120 which is connected to the first sourceline SL1. As a non-limiting example, Word-A and Word-B can be 32 bits and resistors 125, 130, 135, 140, 145, 150, 155, and 160 can be variable resistors.

In an in-memory BNN computation operation of FIG. 1, a binary neural network enable signal (i.e., BNN_en signal) is enabled. Further, both wordlines (i.e., WL1 and WL2) are enabled (i.e., at a voltage power signal VDD), the first sourceline SL1 is connected to a compute-line CL (as shown in the black dotted arrow), and the second sourceline SL2 is connected to the voltage power signal VDD. As shown by the gray dotted arrows, the current flows from the second sourceline SL2 to the first sourceline SL1 through the bits (i.e., Bit-0 and Bit-1) of both rows. The magnitude of the output current Iout for the differential memory array structure 10 represents a binary convolution output of two operand addresses (i.e., Word-A or "A" and Word-B or "B"). In particular, the equation for the output current Iout can be represented as follows:

$$I_{OUT} = \sum_{n=0}^{N} i_n \quad \text{(Equation 1)}$$
$$= \text{popcount}(A \text{ XNOR } B)$$
$$= \text{Binary convolution}(A, B)$$

In equation 1, the output current Iout is the summation of currents across a row. Therefore, the output current Iout can be represented by the popcount of the value of A XNOR B. The popcount is a number of set bits (i.e., "1") in a binary representation of a number. For example, the popcount of 110010001 is 4 (i.e., there are 4 number of "1" in this binary representation). Thus, the popcount of the value of A XNOR B represents the binary convolution of A and B and the output current Iout.

Figure 2:
FIG. 2 shows a logic table for the differential memory array structure in accordance with aspects of the present disclosure.

FIG. 2 shows a logic table for the differential memory array structure in accordance with aspects of the present disclosure. In FIG. 2, the logic table 200 for the differential memory array structure computes a XNOR of A0 and B0 in FIG. 1. As discussed above with respect to FIG. 1, A0 represents Word-A and Bit-0. Further, B0 represents Word-B and Bit-0. A0' and B0' represent the complements of A0 and B0. VDD represents the voltage power signal, $R_{AP}$ is the electrical resistance in the anti-parallel state (high resistance state) of a magnetic tunnel junction (MTJ), and $R_P$ is the electrical resistance in the parallel state (low resistance state) of the MTJ.

In FIG. 2, when A0 is "0" and B0 is "0", the current i0 is $VDD/(R_{AP}+R_{AP})+ VDD/(R_P+R_P)$ and the XNOR operation of A0 and B0 is "1". Further, when A0 is "0" and B0 is "1", the current i0 is $VDD/(R_{AP}+R_P)+ VDD/(R_P+R_{AP})$ and the XNOR operation of A0 and B0 is "0". When A0 is "1" and B0 is "0", the current i0 is $VDD/(R_P+R_{AP})+ VDD/(R_{AP}+R_P)$ and the XNOR operation of A0 and B0 is "0". Lastly, when A0 is "1" and B0 is "1', the current i0 is $VDD/(R_P+R_P)+ VDD/(R_{AP}+R_{AP})$ and the XNOR operation of A0 and B0 is "1".

Although FIG. 2 merely shows the table 200 for A0 (i.e., Word-A and Bit-0) and B0 (Word-B and Bit-0), one of ordinary skill in the art would understand that a similar table can be shown for A1 (Word-A and Bit-1) and B1 (Word-B and Bit-1). Further, VDD, $R_P$, and $R_{AP}$ in FIG. 2 can be varied with a constant tunnel magnetoresistance (TMR) to optimize a current margin and the output current Iout and sense a difference between the popcount using an analog to digital converter (ADC).

Figure 3:
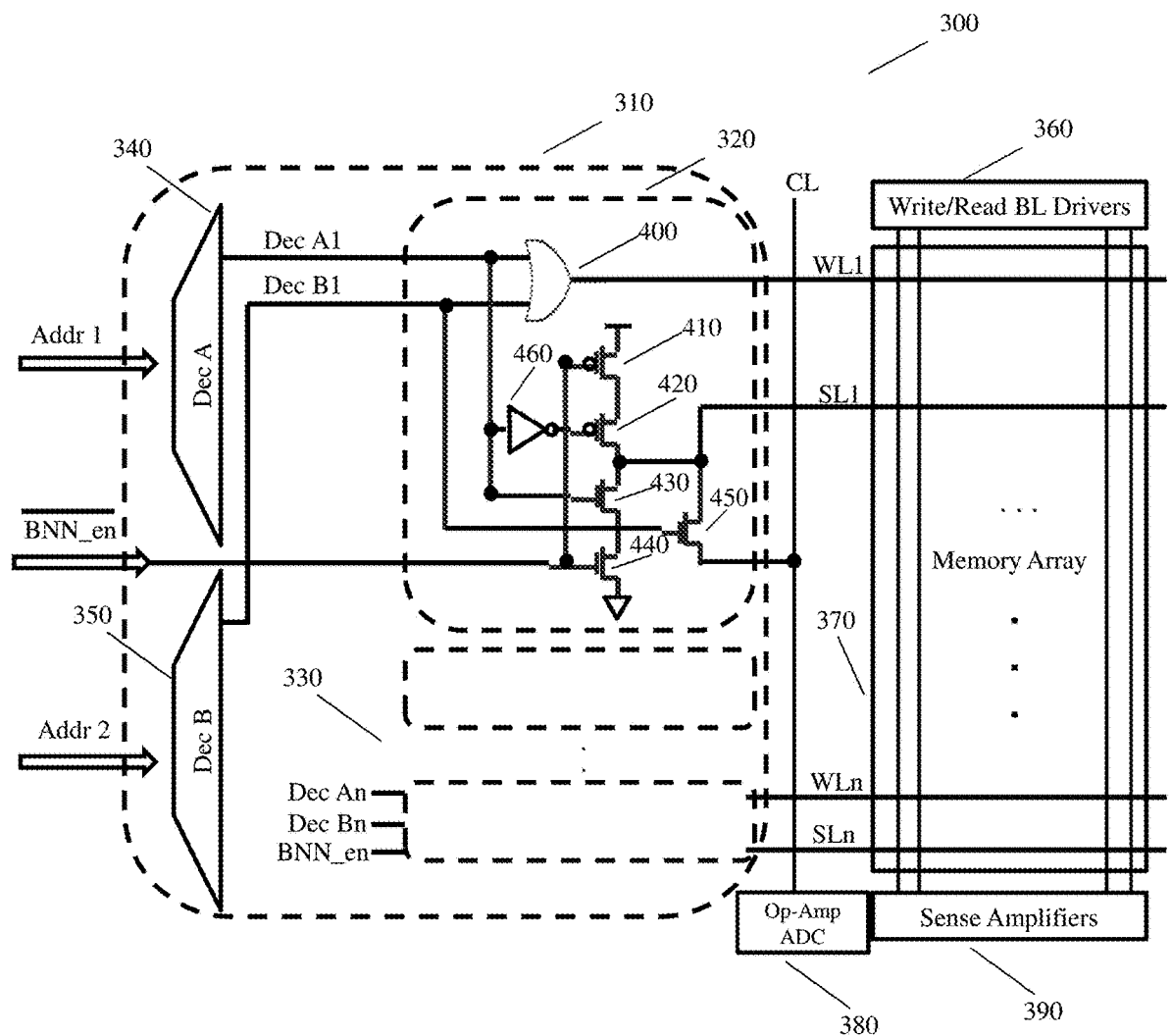
FIG. 3 shows an overview of a peripheral circuit which includes an enhanced decoder in accordance with aspects of the present disclosure.

FIG. 3 shows an overview of a peripheral circuit which includes an enhanced decoder in accordance with aspects of the present disclosure. The peripheral circuit 300 includes an enhanced decoder 310, write/read bitline drivers 360, a memory array 370, an operational-amplifier (Op-Amp) and analog to digital converter (ADC) 380, and sense amplifiers 390. Further, the enhanced decoder 310 includes a writeline/sourceline driver 320, remaining writeline/sourceline drivers 330, a first address decoder Dec A 340, and a second address decoder Dec B 350.

In FIG. 3, the writeline/sourceline driver 320 further includes an OR gate 400, a first PMOS transistor 410, a second PMOS transistor 420, a ninth NMOS transistor 430, a tenth NMOS transistor 440, an eleventh NMOS transistor 450, and an inverter 460. The enhanced decoder 310 includes a first address input Addr 1 of a first operand, a second address input Addr 2 of a second operand, and a binary neural network enable BNN_en signal. Further, wordlines (e.g., the first wordline WL1) of the peripheral circuit 300 can be connected to an enhanced decoder (e.g., the enhanced decoder 310) and the bitlines and complement bitlines (e.g., first bitline BL1 and the first bitline complement BLB1) can be connected to read/write drivers (e.g., write/read bitline drivers 360) and sense amplifiers (e.g., sense amplifiers 390). The compute-line CL can be at a periphery of the peripheral circuit 300 and can be connected to an operational amplifier and analog to digital converter (e.g., the Op-Amp and ADC 380) in a vertical direction.

In FIG. 3, the first wordline WL1 and the first sourceline SL1 connects the writeline/sourceline driver 320 to the compute-line CL and the memory array 370. Further, a wordline WLn and a sourceline SLn of the remaining writeline/sourceline drivers 330 is also connected to the compute-line CL and the memory array 370. The write/read bitline drivers 360 are connected to the memory array 370 and the sense amplifiers 390. The binary neural network enable $\overline{BNN\_en}$ signal is connected to the writeline/sourceline driver 320 and the remaining writeline/sourceline drivers 330. Lastly, the compute-line CL is connected to the Op-Amp and ADC 380.

Also, in the enhanced decoder 310 of FIG. 3, the first address input Addr 1 of the first operand is input to the first address decoder Dec A 340 and the second address input Addr 2 is input to the second address decoder Dec B 350. The output of the first address decoder Dec A 340 and the output of the second address decoder Dec B 350 is input to the OR gate 400 of the writeline/sourceline driver 320. The output of the OR gate 400 is connected to the first wordline WL1.

In the enhanced decoder 310 of FIG. 3, the first PMOS transistor 410 has a source connected to a voltage supply, a gate connected to the binary neural network enable $\overline{BNN\_en}$ signal, and a drain connected to a source of the second PMOS transistor 420. The second PMOS transistor 420 has a gate connected to the inverter 460 and a drain connected to a drain of the ninth NMOS transistor 430. The ninth NMOS transistor 430 has a gate connected to the input of the inverter 460 and a source connected to a drain of the tenth NMOS transistor 440. The tenth NMOS transistor 440 has a gate connected to the binary neural network enable $\overline{BNN\_en}$ signal and a source connected to ground. Lastly, the eleventh NMOS transistor 450 has a drain connected to the first sourceline SL1, a gate connected to the output of the second address decoder Dec B 350, and a source connected to the compute-line CL. The OR gate 400 can drive the first wordline WL1. The inverter 460, PMOS transistors 410, 420, and NMOS transistors 430, 440 drive the first sourceline SL1. Lastly, the NMOS transistor 450 connects the compute-line CL to the first sourceline SL1.

In an in-memory BNN computation operation of FIG. 3, the binary neural network enable BNN_en signal is enabled. When the BNN_en signal is enabled, the $\overline{BNN\_en}$ signal is "0". In this situation, the first wordline WL1 is enabled, the tenth NMOS transistor 440 is off, and the first sourceline SL1 is connected to the Op-Amp and ADC 380 through the compute-line CL. The magnitude of the output current Iout represents the binary convolution output of the first address input Addr 1 of the first operand and the second address input Addr 2. The Op-Amp and ADC 380 converts the analog input of the output current Iout to a digital output for the in-memory BNN computation.

In a write operation of FIG. 3, the binary neural network enable BNN_en signal is disabled. When the BNN_en signal is disabled, the $\overline{BNN\_en}$ signal is "1". In this situation, the first wordline WL1 is connected to the voltage power signal VDD, the tenth NMOS transistor 440 is on, and the first sourceline SL1 is connected to ground through NMOS transistor 440. In the write operation, only one address (i.e., the first address input Addr 1) is input to the first address decoder Dec A 340. The write/read bitline drivers 360 are used to write data of the first address input Addr 1 into the memory array 370.

In a read operation of FIG. 3, the binary neural network enable BNN_en signal is disabled. When the BNN_en signal is disabled, the $\overline{BNN\_en}$ signal is "1". In this situation, the first wordline WL is connected to the voltage power signal VDD, the tenth NMOS transistor 440 is on, and the first sourceline SL1 is connected to ground through NMOS transistor 440. In the read operation, only one address (i.e., the first address input Addr 1) is input to the first address decoder Dec A 340. The write/read bitline drivers 360 are used to sense a differential voltage on the first bitline BL1 and the first bitline complement BLB1 to sense a bit.

The circuit and the method for in-memory binary convolution of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and the method for in-memory binary convolution of the present disclosure has been adopted from integrated circuit (IC) technology. For example, the structures are built on wafers and are realized in films of material patterned by photolithographic processes on the top of a wafer. In particular, the fabrication of the circuit and the method for in-memory binary convolution uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Further, the circuit and the method for logic-in-memory computations of the present disclosure can have wide applicability in high throughput processors for machine learning and artificial intelligence.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a differential memory array circuit which is configured to perform a binary convolution of two input word operands by accumulating a summation of currents through a plurality of bits which are each arranged between a wordline and a sourceline in a horizontal direction and bitlines in a vertical direction,
wherein each of the plurality of bits comprise two devices,
a first device of the two devices comprises a source connected to a bitline and a drain connected to a first resistor of two resistors, and
a second device of the two devices comprises the source connected to a second resistor of the two resistors and a drain connected to a complementary bitline.

2. The structure of claim 1, wherein the two devices are between the wordline and the sourceline in the horizontal direction and bitlines in the vertical direction.

3. The structure of claim 2, wherein each of the two devices are a NMOS transistor.

4. The structure of claim 3, wherein each of the plurality of bits comprise the two resistors.

5. The structure of claim 4, wherein the first device of the two devices comprises a gate connected to the wordline and the second device of the two devices comprises the gate connected to the wordline.

6. The structure of claim 1, wherein the sourceline is an input to an operational amplifier (OpAmp) and analog to digital converter (ADC).

7. The structure of claim 1, wherein the differential memory array circuit further comprises a sense amplifier between the bitlines in the vertical direction.

8. The structure of claim 1, wherein the differential memory array structure comprises a spin-transfer torque magnetic random-access memory (STT MRAM).

9. The structure of claim 1, wherein the differential memory array structure comprises one of memristor devices and phase-change material devices.

10. The structure of claim 1, further comprising an enhanced decoder configured to receive a first address to a first input word operand of the two input word operands and a second address to a second input word operand of the two input word operands, and the enhanced decoder further comprises a first address decoder configured to receive the first address to the first input word operand and a second address decoder configured to receive the second address to the second input word operand.

11. The structure of claim 10, wherein the first address decoder is configured to output a first decoder output corresponding to the first address of the first input word operand to a writeline/sourceline driver and the second address decoder is configured to output a second decoder output corresponding to the second address of the second input word operand to the writeline/sourceline driver.

12. A circuit, comprising:
an enhanced decoder which is configured to receive a first address to the first input word operand and a second address to the second input word operand and output a binary convolution output of the first input word operand and the second input word operand stored in a memory; and
an operational amplifier (OpAmp) and analog to digital converter (ADC) configured to receive the binary convolution output and convert the binary convolution output to a digital output for an in-memory binary neural network (BNN) computation,
wherein the enhanced decoder further comprises a first address decoder configured to receive the first address to the first input word operand and a second address decoder configured to receive the second address to the second input word operand, and
the first address decoder is configured to output a first decoder output corresponding to the first address of the first input word operand to a writeline/sourceline driver and the second address decoder configured to output a second decoder output corresponding to the second address of the second input word operand to the writeline/sourceline driver.

13. The circuit of claim 12, wherein the writeline/sourceline driver comprises an OR gate which is configured to receive the first decoder output and the second decoder output to drive a wordline signal.

14. The circuit of claim 13, wherein the writeline/sourceline driver further comprises an inverter and four transistors to drive a sourceline signal.

15. The circuit of claim 14, wherein the four transistors comprise two PMOS transistors and two NMOS transistors.

16. The circuit of claim 14, wherein the writeline/sourceline driver further comprises another transistor which is configured to connect the sourceline signal to a compute-line signal in response to a binary neural network (BNN) enable signal being enabled.

17. The circuit of claim 14, wherein the writeline/sourceline driver further comprises another transistor which is configured to connect the sourceline signal to ground in response to a binary neural network (BNN) enable signal not being enabled.

18. A method, comprising:
enabling a binary neural network (BNN) enable signal to perform an in-memory binary neural network (BNN) computation in a differential memory array circuit;
inputting a first address to the first input word operand and a second address to the second input word operand to the differential memory array circuit;
performing a binary convolution of the first input word operand and the second input word operand in the differential memory array circuit by accumulating a summation of currents through a plurality of bits in the differential memory array circuit; and
outputting a binary convolution output as a result of the summation of currents,
wherein, in response to the BNN enable signal being enabled, a first wordline is enabled, a NMOS transistor is turned off, and a first sourceline is connected to an operational amplifier (OpAmp) and analog to digital converter (ADC) through a compute-line CL.

19. The method of claim 18, further comprising converting the binary convolution output to a digital output for an in-memory binary neural network (BNN) computation.

20. The method of claim 18, further comprising:
enabling a first wordline signal and connecting a first sourceline signal to a voltage power supply signal in the differential memory array circuit; and
enabling a second wordline signal and connecting a second sourceline signal to a compute-line signal in the differential memory array circuit.

* * * * *